(12) United States Patent
Miller et al.

(10) Patent No.: US 6,981,805 B2
(45) Date of Patent: Jan. 3, 2006

(54) MOLDED ELECTRONIC CONNECTOR FORMED FROM A THERMALLY CONDUCTIVE POLYMER COMPOSITION AND METHOD OF MAKING THE SAME

(75) Inventors: James D. Miller, Marietta, GA (US); E. Mikhail Sagal, Warwick, RI (US); Kevin A. McCullough, Warwick, RI (US)

(73) Assignee: Cool Options, Inc., Warwick, RI (US)

( * ) Notice: Subject to any disclaimer, the term of this patent is extended or adjusted under 35 U.S.C. 154(b) by 16 days.

(21) Appl. No.: 11/011,996

(22) Filed: Dec. 14, 2004

(65) Prior Publication Data

US 2005/0095901 A1    May 5, 2005

Related U.S. Application Data

(63) Continuation of application No. 09/916,056, filed on Jul. 26, 2001, now Pat. No. 6,851,869.

(60) Provisional application No. 60/223,228, filed on Aug. 4, 2000.

(51) Int. Cl.
*G02B 6/36* (2006.01)
*H01R 13/00* (2006.01)

(52) U.S. Cl. ......................... 385/92; 439/487
(58) Field of Classification Search .................. 385/92; 439/66, 47, 485, 487
See application file for complete search history.

(56) References Cited

U.S. PATENT DOCUMENTS

| | | | |
|---|---|---|---|
| 5,129,448 A | 7/1992 | Holmberg, Jr. et al. | 165/86 |
| 5,230,632 A | 7/1993 | Baumberger et al. | 439/66 |
| 5,309,320 A * | 5/1994 | Smith | 361/704 |
| 5,344,795 A | 9/1994 | Hashemi et al. | 437/214 |
| 5,371,404 A | 12/1994 | Juskey et al. | 257/659 |
| 5,424,251 A | 6/1995 | Sono et al. | 437/214 |
| 5,430,609 A | 7/1995 | Kikinis | 361/687 |
| 5,511,138 A | 4/1996 | Lebby et al. | 385/14 |
| 5,513,070 A | 4/1996 | Xie et al. | 361/700 |
| 5,552,960 A | 9/1996 | Nelson et al. | 361/687 |
| 5,557,500 A | 9/1996 | Baucom et al. | 361/687 |
| 5,606,341 A | 2/1997 | Aguilera | 345/87 |
| 5,621,613 A | 4/1997 | Haley et al. | 361/687 |
| 5,646,822 A | 7/1997 | Bhatia et al. | 361/687 |
| 5,666,261 A | 9/1997 | Aguilera | 361/681 |
| 5,708,566 A | 1/1998 | Hunninghaus et al. | 361/764 |
| 5,718,282 A | 2/1998 | Bhatia et al. | 165/86 |
| 5,764,483 A | 6/1998 | Ohashi et al. | 361/699 |
| 5,781,409 A | 7/1998 | Mecredy, III | 361/687 |

(Continued)

*Primary Examiner*—Chandrika Prasad
(74) *Attorney, Agent, or Firm*—Barlow, Josephs & Holmes, Ltd.

(57) ABSTRACT

An electronic connector having a housing containing a circuit board with a heat-generating component, such as a photodiode or laser, is provided. The housing is molded over the circuit board and heat-generating component. The housing is made from a moldable, thermally conductive polymer composition containing a base polymer and thermally conductive filler material. Liquid crystal polymers can be used as the base polymer, and boron nitride particles and carbon fibers can be used as the thermally conductive filler materials. In one embodiment, the thermally conductive polymer composition includes 30 to 60% of a base polymer, 25% to 50% of a first thermally conductive filler material, and 10 to 25% of a second thermally conductive filler material. The molded housing is capable of dissipating heat from the heat-generating component. A method for making the electronic connector is also provided.

22 Claims, 6 Drawing Sheets

U.S. PATENT DOCUMENTS

| | | | |
|---|---|---|---|
| 5,790,376 A | 8/1998 | Moore | 361/700 |
| 5,818,693 A | 10/1998 | Garner et al. | 361/700 |
| 5,822,187 A | 10/1998 | Garner et al. | 361/687 |
| 5,828,552 A | 10/1998 | Ma | 361/704 |
| 5,832,987 A | 11/1998 | Lowry et al. | 165/86 |
| 5,847,938 A | 12/1998 | Gammon | 361/816 |
| 5,980,324 A | 11/1999 | Berg et al. | 439/630 |
| 6,027,256 A | 2/2000 | Nightingale et al. | 385/92 |
| 6,162,849 A | 12/2000 | Zhuo et al. | 524/404 |
| 6,851,869 B2 | 2/2005 | Miller et al. | 385/92 |

* cited by examiner

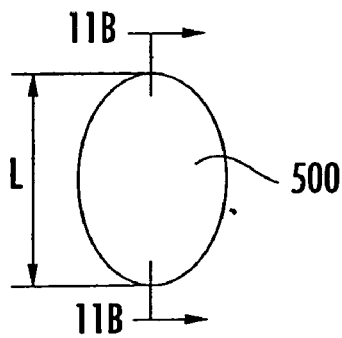
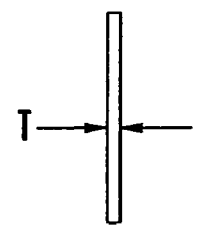
*FIG. 11A.*  *FIG. 11B.*
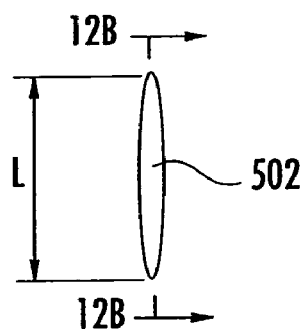
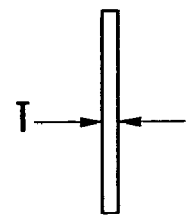
*FIG. 12A.*  *FIG. 12B.*
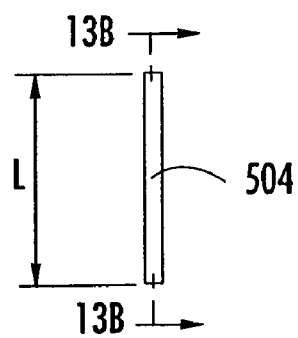
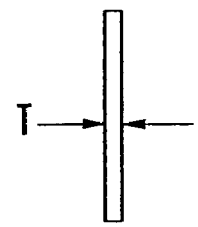
*FIG. 13A.*  *FIG. 13B.*

MOLDED ELECTRONIC CONNECTOR FORMED FROM A THERMALLY CONDUCTIVE POLYMER COMPOSITION AND METHOD OF MAKING THE SAME

CROSS-REFERENCE TO RELATED APPLICATIONS

This application is a continuation of U.S. patent application Ser. No. 09/916,056 having a filing date of Jul. 26, 2001 now U.S. Pat. No. 6,851,869, which claims the benefit of U.S. Provisional Patent Application Ser. No. 60/223,228 having a filing date of Aug. 4, 2000, the entire contents of which are hereby incorporated by reference.

BACKGROUND OF THE INVENTION

The present invention relates generally to electronic connectors, integrated circuit components and housings for such components. More specifically, the present invention relates to connector housings for dissipating heat generated by such connector devices.

In the electronics and computer industries, it has been well known to employ various types of electronic component packages and integrated circuit chips, such as the PENTIUM central processing unit chip (CPU) manufactured by Intel Corporation and RAM (random access memory) chips. These integrated circuit chips have a pin grid array (PGA) package and are typically installed into a socket which is soldered to a computer circuit board. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

In addition to the PENTIUM microprocessor discussed above, there are many other types of electronic devices that include some type of electronic heat generating component that is in need of heat dissipation. In the prior art, there are electronic connectors used to couple various electronic components together. For example, opto-electronic connector are frequently used to provide an interface between fiber optic cable and electronic devices. These opto-electronic connectors are commonly referred to as transceiver modules and are available in many different form factors. Most commonly, these connectors are employed as an I/O data interface between a computer and fiber optic cable. Each connector, for example, may use 1–3 Watts of power. Since these devices are very high density and require precision alignment of sensitive optical components, avoidance of housing creep and housing failure is critical.

These opto-electronic transceiver connectors are well known and are typically made of metal, such as aluminum, and are cast or machined into the desired configuration. Such manufacturing techniques are expensive and cumbersome, particular where the connector includes complex geometries. The metal housing is important for heat dissipating and can also be used for grounding or EMI shielding, if necessary.

In the heat sink industries, which is applicable to the electronic connector industry, it has been well known to employ metallic materials for thermal conductivity applications, such as heat dissipation for cooling semiconductor device packages and for constructing EMI shields. For these applications, the metallic material typically is tooled or machined from bulk metals into the desired configuration. However, such metallic conductive articles are typically very heavy, costly to machine and are susceptible to corrosion. Further, the geometries of machined metallic heat dissipating articles are very limited to the inherent limitations associated with the machining or tooling process. As a result, the requirement of use of metallic materials which are machined into the desired form, place severe limitations on heat sink design particular when it is known that certain geometries, simply by virtue of their design, would realize better efficiency but are not attainable due to the limitations in machining metallic articles.

Alternatively, the connectors may be manufactured of plastic, such as by injection molding, which is a relatively inexpensive process. However, such plastic material is inadequate for providing heat dissipating and/or grounding. A plastic connector may be plated but provides inferior thermal conductivity. The advantages of plastic is that it is very lightweight. However, the use of conventional plastic materials is highly disadvantageous because the plastic is insulative thus trapping generated heat within the connector. Such heat build makes the connector susceptible to housing failure.

The aforementioned electronic connectors are commonly employed in communications equipment, and the like. These devices are being manufactured smaller and smaller and include faster and faster electronic components therein. As a result, heat generation and overheating continues to be a serious concern while the sizes of the devices get smaller. Therefore, problems arise as to effectively cooling the small electronic components within small and cramped environments within the electronic connector device. Typical cooling solutions are not preferred because they are large and, as a result, consume large spaces within an already cramped electronic device case. This is particularly of concern when hundreds if not thousands of these connector components are at a single location. Also, these small connectors must address the competing demands of high power requirements and associated power limitations. Therefore, active cooling solutions, such as powered fans and the like, are not desirable.

Moreover, electromagnetic interference shielding is also often required to ensure proper operation of the electronic connector device. However, the use of EMI shielding, which typically encases the electronic component within the device to be protected, obstructs proper installation and use of effective solutions for cooling the same component within the electronic connector. Therefore, there are competing needs for EMI shielding and effective thermal solutions within an electronic connector, such as an opto-electronic connector, particularly in environments where space is at a premium.

In view of the foregoing, there is a demand for an electronic connector that has a low profile and is net-shape moldable from a thermally conductive material so complex geometries for optimal cooling configurations can be achieved. There is also a demand for an electronic connector that provides passive heat dissipation for a heat generating electronic components within the connector housing. There is further demand for an electronic connector to provide both EMI shielding and superior heat dissipation. Therefore, an inexpensive lightweight injection molded connector is highly desired that can be easily and cheaply manufactured yet still be highly thermally conductive and have EMI shielding capability.

SUMMARY OF THE INVENTION

The present invention preserves the advantages of prior art electronic connectors for electronic devices. In addition, it provides new advantages not found in currently available electronic connectors and there associated housing. The electronic connector of the present invention overcomes many disadvantages of such currently available electronic connectors and their housings.

The invention is generally directed to the novel and unique electronic connector that includes an improved heat dissipating housing for cooling heat generating devices located within the connector. The electronic connector of the present invention enables the cost-effective cooling of electronic devices within the connector while realizing superior thermal conductivity and improved electromagnetic shielding.

In accordance with the present invention, an electronic connector is provided which includes a heat generating electronic component capable of electronically coupling two data devices together and a housing positioned about the heat generating electronic component where the housing is made of a thermally conductive material. The housing is in thermal communication with the heat generating electronic component with heat being dissipating from the heat generating electronic component and through the housing.

Also, the present invention provides a method of forming an electronic connector that includes the steps of first providing a heat generating electronic component capable of electronically coupling two data devices together having a first port and a second port. This component is typically mounted or installed into a circuit board. An outer housing of moldable thermally conductive polymer material is overmolded around the heat generating electronic component leaving the first port and said second port of the connector exposed.

It is therefore an object of the present invention to provide an electronic connector that enhances the dissipation of heat from a heat generating electronic component housed therein.

It is an object of the present invention to provide an electronic connector that has an outer housing that directly provides heat dissipation for a heat generating electronic component housed therein.

It is a further object of the present invention to provide an electronic connector that passively provides heat dissipation for a heat generating electronic component housed therein.

Another object of the present invention is to provide an electronic connector that has a housing that simultaneously provides electromagnetic shielding and heat dissipation for an electronic component.

It is a further object of the present invention to provide an electronic connector with a housing that is injection moldable of a thermal composite material into complex geometries to enhance thermal dissipation.

BRIEF DESCRIPTION OF THE DRAWINGS

The novel features that are characteristic of the present invention are set forth in the appended claims. However, the preferred embodiments of the invention, together with further objects and attendant advantages, will be best understood by reference to the following detailed description taken in connection with the accompanying drawings in which:

FIG. 11A is a top view of a high aspect ratio filler member of a flake-like configuration;

FIG. 11B is a cross-sectional view through the line 11B—11B of FIG. 11A;

FIG. 12A is a top view of a high aspect ratio filler member of a rice-like configuration;

FIG. 12B is a cross-sectional view through the line 12B—12B of FIG. 12A;

FIG. 13A is a top view of a high aspect ratio filler member of a strand-like configuration;

FIG. 13B is a cross-sectional view through the line 13B—13B of FIG. 13A;

DETAILED DESCRIPTION OF THE PREFERRED EMBODIMENTS

For illustration purposes only and by way of example, the present invention is shown to be employed for a small form factor transceiver opto-electronic module. As will be seen below, the electronic connector 10 of the present invention can be easily employed in other electronic connector environments, such as PCMCIA computer peripheral cards, zero insertion force (ZIF) sockets and universal serial bus (USB) connectors, for example. The invention will be described in detail below in the context of an application for a small form factor opto-electronic transceiver module, however, such disclosure is not intended to limit the scope of the present invention to such an application of the present invention.

Figure 1:
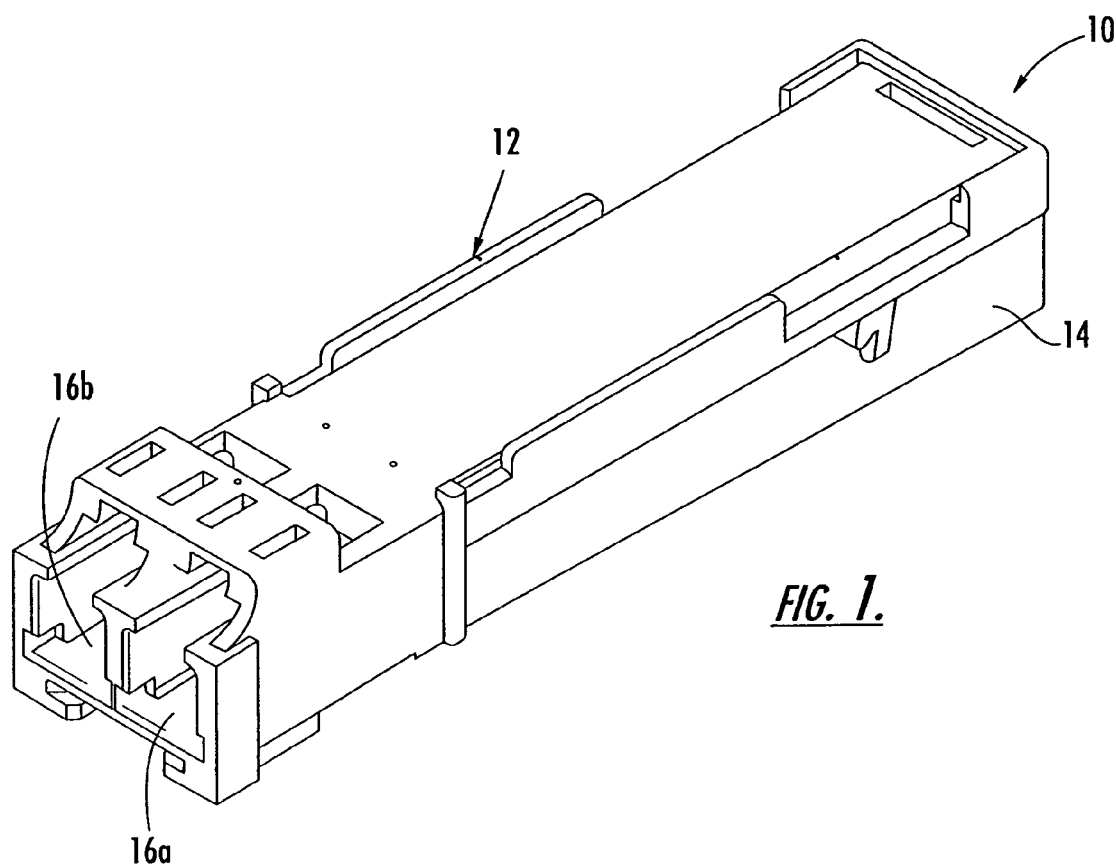
FIG. 1 is a perspective view of the electronic connector of the present invention.

Referring to FIGS. 1–6, the electronic connector 10 of the present invention is shown which is a small form factor opto-electronic transceiver module. This connector 10 provides an interface between fiber optic cable and electronic cable. Referring specifically to FIG. 1, the electronic connector 10 includes a housing 12 with a bottom cover 14. The electronic connector 10 is shown in a given orientation but may be oriented as needed in the field. The electronic connector 10 includes a pair of modular female ports 16a and 16b for receiving respective cables fit with complementary male plugs (not shown). Details of the interconnection of fiber optic cable and electronic cable are not discussed herein as they are well know in the prior art.

Figure 2:
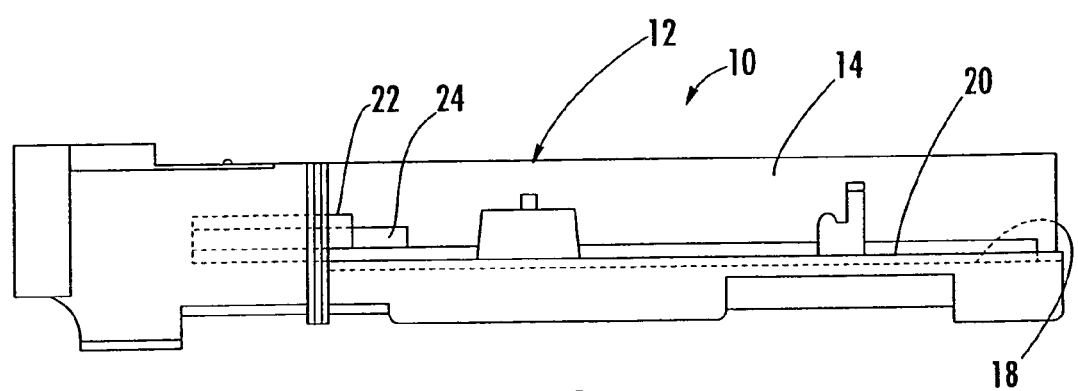
FIG. 2 is an inverted side view of the electronic connector of FIG. 1.
Figure 3:
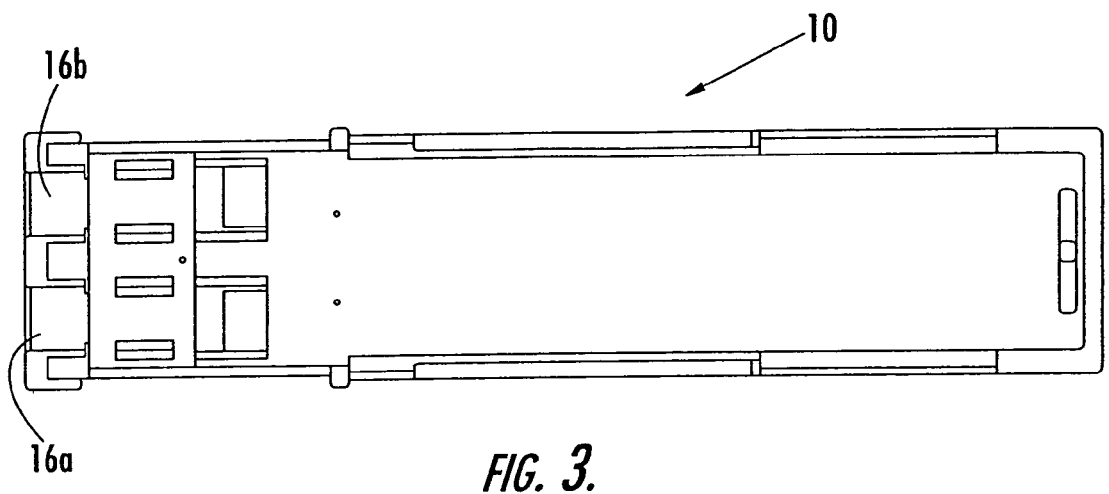
FIG. 3 is a top view of the electronic connector of FIG. 1.
Figure 4:
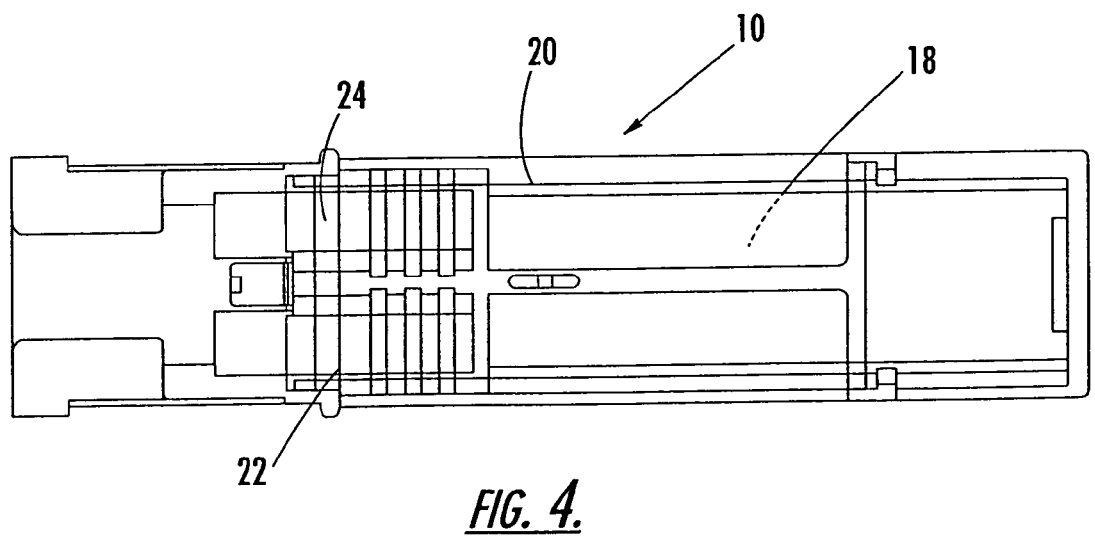
FIG. 4 is a bottom view of the electronic connector of FIG. 1 with top cover removed.
Figure 5:
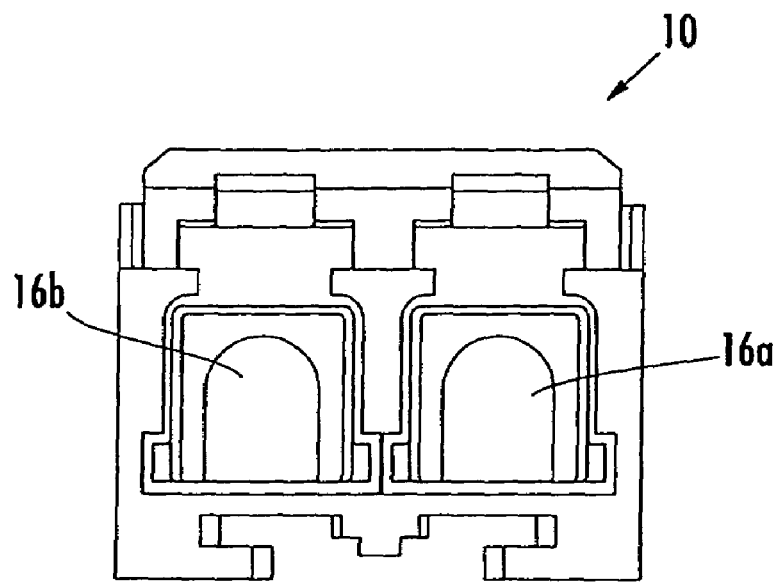
FIG. 5 is a front view of the electronic connector of FIG. 1.
Figure 6:
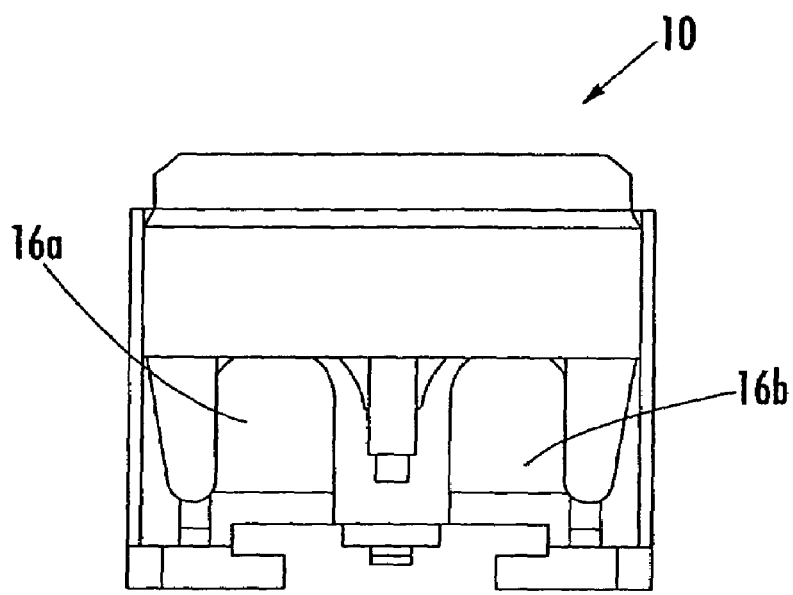
FIG. 6 is a rear view of the electronic connector of FIG. 1.

FIG. 2 illustrates an inverted side view of the electronic connector shown in FIG. 1. The outer housing 12 includes a board carrying surface 18 as best seen in FIG. 4. A circuit board 20 is installed on the board carrying surface 18 of the housing 12. Residing on the circuit board 20 are a number of different electronic components, such as a photo-diode 22 and a laser 24 along with other electronic circuitry. These components 22, 24 and circuitry enable the opto-electronic transceiver connector to serve as an I/O data interface between a computer and fiber optic cable. As also seen in FIGS. 5 and 6, the connector 10 is provided with an input port 16a and an output port 16b to enable bi-directional data communication. The photo-diode 22 is mounted in the input port 16a and converts optically transmitted data, via appropriate circuitry, to electronically transmitted data for processing. The laser 24 is provided in the output port 16b of the connector 10 to enable communication from electronically transmitted data back to optically transmitted data.

Some of electronic components residing on the circuit board, such the laser 24, operate at very high temperatures which may cause heat to build up within the housing 12 of the connector 10. Excessive heat within the connector 10 places it at risk of overheating and resultant component or overall system failure. To address the heat associated with electronic components within the connector 10 that run hot, the present invention provides connector housing 12 that is made of a thermally conductive material that is formed of a base matrix of a polymer composition with a thermally conductive filler loaded therein. The composition is discussed in detail in connection with FIGS. 7–16. The housing 12 is preferably a separate member to the internal electronic components therein, however, the housing 12 may be integrally overmolded about the internal electronic components, including the circuit board 20 and electronic components 22,24 residing thereon.

The polymer base matrix is preferably a liquid crystal polymer but may also be other moldable materials, such as polycarbonate material. In accordance with the method of the present invention, the electronic connector 10 is molded, preferably by injection molding, into the desired shape, namely of a shape such as that shown in FIGS. 1–6. The resultant part is net-shape moldable which means that the part, when molded, is in its finished shape and configuration without needing additional machining, cutting or the like, which is typically needed for other prior art connector materials including metal. Details of injection molding techniques need not be discussed herein as they are well known in the prior art.

Turning now to FIGS. 7–10, various different thermally conductive molded compositions are shown which may be employed in the electronic connector 10 and method of forming an electronic connector 10 in accordance with the present invention.

Figure 7:
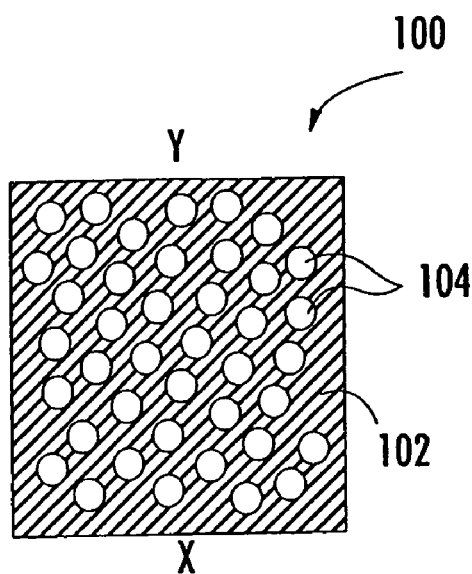
FIG. 7 is a cross-sectional view of a first example to thermally conductive material used in connection with the present invention.
Figure 8:
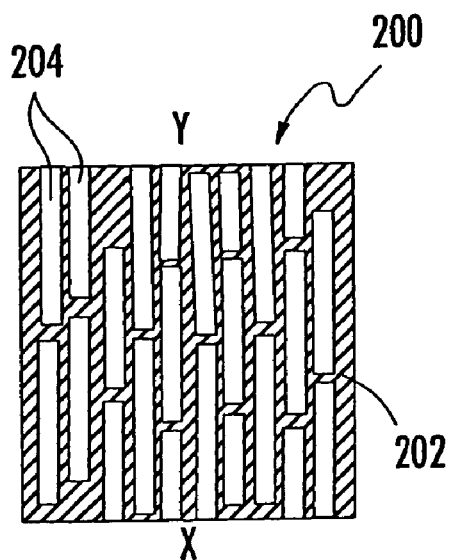
FIG. 8 is a cross-sectional view of a second example of thermally conductive material used in connection with the present invention.

In FIGS. 7 and 8, composite materials 100 and 200 generally show a base matrix of polymer 102, 202 for example, with different types of filler material 104 and 204, respectively. Each of these compositions are shown in enlarged detail for clarity and ease of illustration.

As seen in FIG. 7, a cross-sectional view of a composite material 100 with a base polymer matrix 102 and spheroid filler 104 is provided. In this prior art example, the base matrix 102 is loaded with low aspect ratio filler 104 which typically has a length to width ratio less than 5:1. For example, the mixture may include, by volume, 40 base matrix and 60 percent granular or spheroid filler. The base polymer matrix 102 is, essentially, non-conductive and the spheroid filler 104 is a metallic material or boron nitride which has an independent thermal conductivity of on the order of approximately 400 W/m° K.

As can be understood, the loading of thermally conductive filler in a polymer base matrix 102 will render the material 100 thermally conductive while permitting the material 100 to be moldable. As a result, this moldable thermally conductive material 100 is well-suited for molding an electronic connector 10, such as the one shown in FIGS. 1–6.

When employed as a thermal conductor, the material 100 must thermally transfer heat from, for example, side X to side Y of the material. During this transfer, heat must travel from heat conductive filler member 104 to the adjacent heat conductive filler member 104 to travel the path from X to Y. Since the selected filler 104 in FIG. 7 are low aspect ratio granular or spheroid members, heat must cross many interfaces between several filler members as well as the non-conductive polymer 102 residing therebetween. The more interfaces that heat must cross and the more polymer 102 the heat must pass through, the more degraded the thermal conductivity will be. Further, too much loading of filler material 104 prevents the base polymer 104 from wetting out resulting in undesirable small air pockets in the finished molded product.

Turning now to FIG. 8, an ideal composition 200 shows the employment of high aspect ratio filler 204 within a polymer base matrix 202. FIG. 8 illustrates the efforts to solve the aforementioned problems associated with having too many interfaces and too much polymer 202 between the two points of heat travel. FIG. 8 shows an ideal composition 200 where high aspect ratio filler 204 is perfectly aligned within polymer base matrix 202. In this ideal composition 200, high aspect ratio filler 204 aligns perfectly to reduce the number of interfaces the heat must cross and the volume of polymer 202 the heat must travel through. In this ideal composition, only two or three interfaces are encountered when going from point X to Y as opposed to the 7 or 8 encountered by composition 100 shown in FIG. 7. Therefore, the composition shown in FIG. 8 may be more desirable in certain applications.

While the composition 200 shown in FIG. 8 is ideal and preferred, it is virtually impossible to achieve in the field. This is primary due to geometry of the part to be molded. As stated earlier, one of the primary reasons for employing a thermally conductive plastic composition is that it is moldable into more complex geometries to achieve better heat dissipation. Complex constructions, such as the connector shown in FIGS. 1–6, can be easily formed in accordance with the present invention. Therefore, intricate part geometries are typically encountered when molding thermally conductive polymer materials.

With these intricate geometries, turbulence of the flow of the filler loaded matrix is common resulting in collisions of the filler material and non-uniform alignment. While parallel aligned of the high aspect ratio filler is obviously preferred, it cannot be attained. Further, the turbulence of flow and collisions with edges of the mold often breaks the high aspect ratio filler particularly when it has an aspect ratio larger than 20:1.

Figure 9:
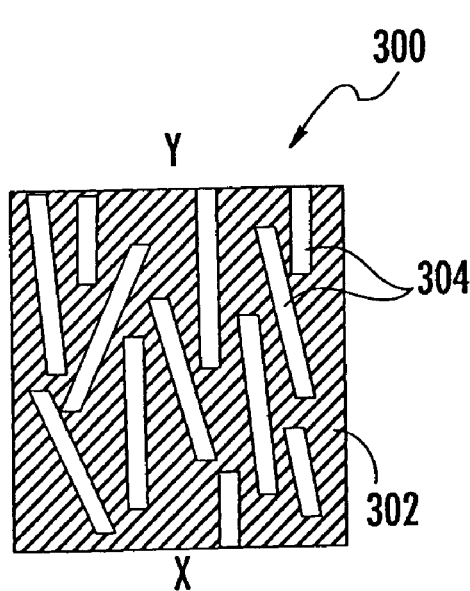
FIG. 9 is a cross-sectional view of a third example of thermally conductive material used in connection with the present invention.

FIG. 9 illustrates a realistic composition 300 with filler 304 being somewhat aligned to adjacent filler 304 within polymer 302. FIG. 9 is what is encountered in the field, due to the inherent problems associated with molding material with filler 304 therein, as opposed to the theoretically ideal arrangement shown in FIG. 8. As can be seen in FIG. 9, the number of interfaces or transitions from one filler 304 to another to travel from point X to Y is reduced as compared to FIG. 7, however, the volume of non-thermally conductive polymer material in the path of travel is increased thus greatly reducing the overall conductivity of the composition through the path X to Y. Further, breakage of the high aspect ratio filler 304 will cause the thermal conductivity of the composition 300 to degrade as well.

Figure 10:
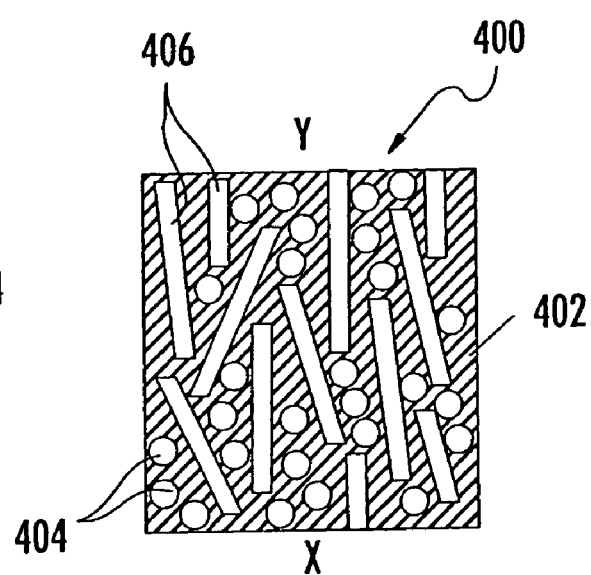
FIG. 10 is a cross-sectional view of a fourth example of thermally conductive material used in connection with the present invention.

Turning now to FIG. 10, another composition 400, that may be used to carry out the present invention, is shown. Composition 400 includes a base matrix 402 which is preferably a polymer material, such as a liquid crystal polymer. Loaded into the polymer base matrix 402 are low aspect ratio filler 404 and high aspect ratio filler 406 which are both highly thermally conductive materials. The present invention is the employment of both low aspect ratio filler 404 and high aspect ratio filler 406 within the same base matrix 402. As shown in FIG. 9, perfect parallel alignment of high aspect ration filler 304 is not possible. As a result, too many voids between the poorly aligned high aspect ratio filler 304 exist. The present invention employs low aspect ratio filler 404 to fills the voids naturally left between adjacent high aspect ratio filler 406 due to turbulence during molding and complex mold geometries. As a result of the employment of both low aspect ratio filler 404 and high aspect ratio filler 406 within the same composition, the overall number of transitions surfaces can be greatly reduced while replacing the voids with low aspect ratio filler 404 which were previously filled with non-thermally conductive polymer as shown in FIG. 9. The composition 400 may be preferred in certain electronic connectors 10 that require such high thermal conductivity.

The example composition 400, as shown in FIG. 10, includes a base matrix 402 which is preferably manufactured of a liquid crystal polymer. Liquid crystal polymer is preferred due to its highly crystalline nature and its natural tendency to align the filled loaded therein. Various other types of polymers, such as polycarbonate materials, can also be employed. Further, the base matrix 402 may be of metallic material if die casting of the thermally conductive body is required for the application.

Figure 14:
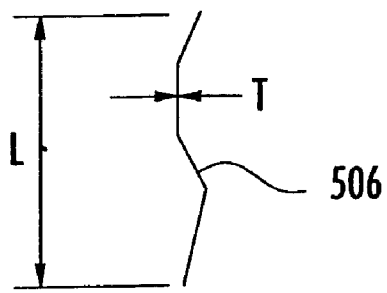
FIG. 14 is a top view of a high aspect ratio filler member of a whisker-like configuration.

As shown in FIGS. 11–16, various different types of high aspect ratio filler may be employed and still be within the scope of the present invention. As shown in FIGS. 11A and 11B, high aspect ratio filler 204, 304 or 406 is shown as a flake-like or plate-like configuration 500 with a length L and thickness T. FIGS. 12A and 12B illustrate another high aspect ratio filler 204, 304 or 406 which is shown to be in a rice-like configuration 502 with length L and thickness T. FIGS. 13A and 13B shown a strand-like configuration 504 with a length L and thickness T. FIG. 14 shows a whisker configuration 506 with length L and thickness T. For example, it is preferred that the high aspect ratio filler 204, 304 or 406 be carbon flakes that are $\frac{2}{1000}$ to $\frac{4}{1000}$ of an inch thick while being $\frac{40}{1000}$ of an inch long to realize a minimum aspect ratio of approximately 10:1. The aspect ratio preferably as high as 50:1 or even greater. While such dimensions are preferred, other sizes of high aspect ratio filler 204, 304 or 406 may be employed depending on the application at hand. Alternatively, carbon fiber that is 200 microns in diameter may also be employed.

In each of these configurations shown in FIGS. 11–14, which are suitable for employment as filler in the composition used to form the connector 10 of the present invention, the aspect ratio of length L to thickness T is at least 10:1. Further, the material employed for the high aspect ratio filler 204, 304 or 406 may be aluminum, alumina, copper, magnesium, brass, nickel and carbon.

Figure 15:
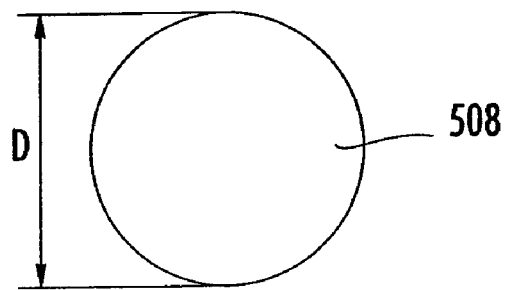
FIG. 15 is a top view of a low aspect ratio spheroid filler member.
Figure 16:
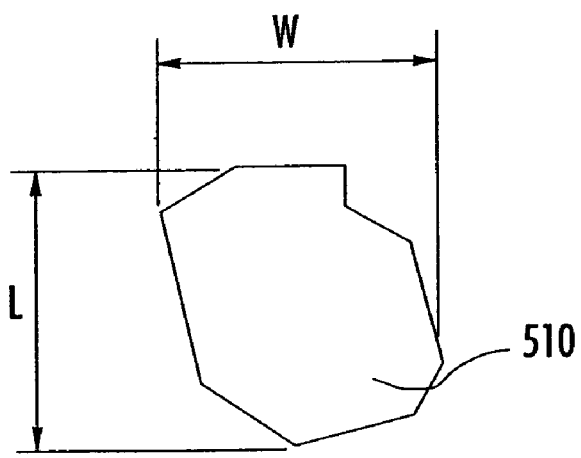
FIG. 16 is a top view of a low aspect ratio grain filler member.

Turning now to FIGS. 15 and 16, two examples of suitable low aspect ratio filler configurations are shown. FIG. 15 shows a substantially spheroid filler configuration 508 where the diameter of the member is D. As a result, the aspect of this filler configuration is approximately 1:1. In addition, FIG. 16 illustrates a grain-like or granular filler configuration 510 to serve as the low aspect ratio filler 114. This granular configuration 510 is somewhat random in shape and may have height H to width W ratio of 2:1, or the like. The low aspect ratio filler 104, 402, in accordance with the present invention, is of a ratio of 5:1 or less. Further, the material employed for the low aspect ratio filler 104, 402 may be aluminum, alumina, copper, magnesium, brass and carbon. The low aspect ratio filler 104, 402 is preferably approximately $\frac{10}{1000}$ of an inch in diameter or along its width but may be of different sizes depending on the application at hand.

In the composite mixture 100, 200, 300, 400 used to form the connector 10 of the present invention, it is preferred that, by volume, the base matrix 102, 202, 302, 402 be 30 to 60 percent; that the high aspect ratio filler 204, 304, 406 be 25 to 50 percent; and that the low aspect ratio filler 104, 404 be 10 to 25 percent. With the foregoing disclosed ranges, high volume loading and proper wet-out can be achieved.

Any thermally conductive thermally conductive moldable composition is suitable for use in forming the electronic connector 10 of the present invention. The combination of a polymer base matrix 102, 202, 302, 402 with both low and high aspect ratio filler loaded therein is preferred. Below is an example and preferred embodiment of the present invention.

EXAMPLE

A base matrix of liquid crystal polymer is provided as 50 percent (by volume) of the composition mixture. High aspect ratio carbon flakes, with an aspect ratio of approximately 50:1 and independent thermal conductivity of approximately 800 W/m° K, are provided as approximately 35 percent (by volume) of the composition mixture. Finally, 15 percent (by volume) of boron nitride granules, with an aspect ratio of approximately 4:1 and independent thermal conductivity of approximately 400 W/m° K, are provided.

The comparison below illustrates the thermal conductivity of the compositions 100, 300 and 400 shown, respectively, in FIGS. 7, 9 and 10.

|  | Base Polymer (by volume) | High Aspect Ratio Filler (by volume) | Low Aspect Ratio Filler (by volume) | Thermal Conductivity (W/m° K) |
| --- | --- | --- | --- | --- |
| FIG. 7 | 40% LCP | N/A | 60% Boron Nitride Grains | 19 |
| FIG. 9 | 50% LCP | 50% Carbon Fiber Random Lengths Min 50:1 Aspect Ratio | N/A | 22 |
| FIG. 10 | 50% LCP | 35% Carbon Fiber Random Lengths Min 50:1 Aspect Ratio | 15% Boron Nitride Grains | 28 |

The electronic connector 10 of the present invention, which employs the moldable composition 100, 200, 300, 400 as stated above, can also exhibit electromagnetic shielding (EMI) shielding properties if desired in a given electronic connector application. The filler material can be selected to be metallic, such as aluminum, to enable the molded material to also provide a shroud of metallic material about the electrical components housed within the connector. The positioning of a metallic material about a electrical component, as is well known in the art, can serve to reflect EMI waves. Also, the filler material can be selected to serve to absorb EMI waves. The appropriate filler material can be selected to serve the desired purpose the application and the environment into which the connector is installed.

In view of the foregoing, a superior electronic connector 10 can be formed by employing highly thermally conductive composite material 100, 200, 300, 400. The electronic connector 10 of the present invention, greatly improves over prior art attempts to provide such a thermally conductive and EMI shielded part. In particular, the present invention, provides an electronic connector 10 that has thermal conductivity that is vastly improved over known electronic connectors to permit complex part geometries to achieve more efficient connectors.

It would be appreciated by those skilled in the art that various changes and modifications can be made to the illustrated embodiments without departing from the spirit of the present invention. All such modifications and changes are intended to be covered by the appended claims.

What is claimed is:

1. An electronic connector, comprising:
   a housing having at least one interface port configured to receive and retain an electronic communication cable and a surface portion adjacent said interface port for receiving a circuit board; and
   a circuit board mounted on the surface portion, the circuit board including a heat-generating component residing thereon, wherein the housing is molded over the circuit board and heat-generating component and the housing is made of a thermally-conductive polymer composition, the composition including a base polymer and thermally-conductive filler material.

2. The electronic connector of claim 1, wherein the base polymer is a liquid crystal polymer.

3. The electronic connector of claim 1, wherein the base polymer is polycarbonate.

4. The electronic connector of claim 1, wherein the thermally-conductive filler material is selected from the group consisting of boron nitride, aluminum, alumina, copper, magnesium, brass, nickel, boron nitride, and carbon materials.

5. The electronic connector of claim 4, wherein the thermally-conductive filler material is in the form of particles.

6. The electronic connector of claim 4, wherein the thermally-conductive filler material is in the form of fibers.

7. The electronic connector of claim 1, wherein the base polymer is a liquid crystal polymer and the thermally conductive filler material is boron nitride particles having an aspect ratio of 5:1 or less.

8. The electronic connector of claim 1, wherein the base polymer is a liquid crystal polymer and the thermally conductive filler material is carbon fiber having an aspect ratio of at least 10:1.

9. An electronic connector, comprising:
   a housing having at least one interface port configured to receive and retain an electronic communication cable and a surface portion adjacent said interface port for receiving a circuit board; and
   a circuit board mounted on the surface portion, the circuit board including a heat-generating component residing thereon, wherein the housing is molded over the heat-generating component and circuit board and the housing is made of a thermally-conductive polymer composition, the composition including i) 30% to 60% by volume of a base polymer, ii) 25% to 50% by volume of a first thermally-conductive filler material having an aspect ratio of at least 10:1, and iii) 10% to 25% by volume of a second thermally-conductive filler material having aspect ratio of 5:1 or less.

10. The electronic connector of claim 9, wherein the base polymer is a liquid crystal polymer.

11. The electronic connector of claim 9, wherein the base polymer is polycarbonate.

12. The electronic connector of claim 9, wherein the first thermally-conductive filler material is selected from the group consisting of aluminum, alumina, copper, magnesium, brass, nickel, boron nitride, and carbon materials.

13. The electronic connector of claim 9, wherein the second thermally-conductive filler material is selected from the group consisting of aluminum, alumina, copper, magnesium, brass, nickel, boron nitride, and carbon materials.

14. The electronic connector of claim 9, wherein the base polymer is a liquid crystal polymer, the first thermally conductive filler material is carbon fiber, and the second thermally conductive filler material is boron nitride particles.

15. The electronic connector of claim 9, wherein the base polymer is polycarbonate, the first thermally conductive filler material is carbon fiber, and the second thermally conductive filler material is boron nitride particles.

16. A method of making an electronic connector having a molded housing, comprising the steps of:
   providing a circuit board including a heat-generating component residing thereon,
   molding a thermally-conductive polymer composition over the heat-generating component and circuit board to form a molded housing and at least one interface port adjacent said circuit board, said interface port configured to receive and retain an electronic communication cable, the composition including a base polymer and thermally-conductive filler material.

17. The method of claim 16, wherein the base polymer is a liquid crystal polymer.

18. The method of claim 16, wherein the base polymer is polycarbonate.

19. The method of claim 16, wherein the thermally-conductive filler material is selected from the group consisting of boron nitride, aluminum, alumina, copper, magnesium, brass, nickel, boron nitride, and carbon materials.

20. A method of making an electronic connector having a molded housing, comprising the steps of:
   providing a circuit board including a heat-generating component residing thereon,
   molding a thermally conductive polymer composition over the heat-generating component and circuit board to form a molded housing and at least one interface port adjacent said circuit board, said interface port configured to receive and retain an electronic communication cable, the composition including: i) 30% to 60% by volume of a base polymer, ii) 25% to 50% by volume of a first thermally conductive filler material having an aspect ratio of at least 10:1, and iii) 10% to 25% by volume of a second thermally conductive filler material having an aspect ratio of 5:1 or less.

21. The method of claim 20, wherein the base polymer is a liquid crystal polymer, the first thermally conductive filler material is carbon fiber, and the second thermally conductive filler material is boron nitride particles.

22. The method of claim 20, wherein the base polymer is polycarbonate, the first thermally conductive filler material is carbon fiber, and the second thermally conductive filler material is boron nitride particles.

* * * * *